United States Patent
Costa et al.

(10) Patent No.: US 9,978,697 B2
(45) Date of Patent: May 22, 2018

(54) MICROELECTRONICS PACKAGE WITH INDUCTIVE ELEMENT AND MAGNETICALLY ENHANCED MOLD COMPOUND COMPONENT

(71) Applicant: Qorvo US, Inc., Greensboro, NC (US)

(72) Inventors: Julio C. Costa, Oak Ridge, NC (US); George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days. days.

(21) Appl. No.: 15/287,202

(22) Filed: Oct. 6, 2016

(65) Prior Publication Data

US 2017/0323860 A1  Nov. 9, 2017

Related U.S. Application Data

(60) Provisional application No. 62/333,317, filed on May 9, 2016.

(51) Int. Cl.
*H01L 23/64* (2006.01)
*H01L 23/00* (2006.01)
(Continued)

(52) U.S. Cl.
CPC ............ *H01L 23/645* (2013.01); *H01L 23/18* (2013.01); *H01L 23/293* (2013.01);
(Continued)

(58) Field of Classification Search
CPC ..... H01L 23/645; H01L 23/18; H01L 23/293; H01L 23/3114; H01L 23/66; H01L 24/16
See application file for complete search history.

(56) References Cited

U.S. PATENT DOCUMENTS 4,093,562 A   6/1978  Kishimoto
4,366,202 A  12/1982  Borovsky
(Continued)

FOREIGN PATENT DOCUMENTS

CN   103811474 A   5/2014
EP     2996143 A1   3/2016
(Continued)

OTHER PUBLICATIONS

Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.

(Continued)

*Primary Examiner* — Yasser A Abdelaziez
(74) *Attorney, Agent, or Firm* — Withrow & Terranova, P.L.L.C.

(57) ABSTRACT

The present disclosure relates to a microelectronics package with an inductive element and a magnetically enhanced mold compound component, and a process for making the same. The disclosed microelectronics package includes a module substrate, a thinned flip-chip die with an upper surface that includes a first surface portion and a second surface portion surrounding the first surface portion, the magnetically enhanced mold compound component, and a mold compound component. The thinned flip-chip die is attached to the module substrate and includes a device layer with an inductive element embedded therein. Herein, the inductive element is underlying the first surface portion and not underlying the second surface portion. The magnetically enhanced mold compound component is formed over the first surface portion. The mold compound component is formed over the second surface portion, not over the first (Continued)

surface portion, and surrounding the magnetically enhanced mold compound component.

22 Claims, 13 Drawing Sheets

(51) Int. Cl.
  *H01L 23/18*    (2006.01)
  *H01L 23/31*    (2006.01)
  *H01L 23/29*    (2006.01)
  *H01L 23/66*    (2006.01)
(52) U.S. Cl.
  CPC .......... *H01L 23/3114* (2013.01); *H01L 23/66* (2013.01); *H01L 24/16* (2013.01)

(56) References Cited

U.S. PATENT DOCUMENTS

| | | |
|---|---|---|
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,831,369 A | 11/1998 | Fürbacher et al. |
| 5,920,142 A | 7/1999 | Onishi et al. |
| 6,072,557 A | 6/2000 | Kishimoto |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,864,156 B1 | 3/2005 | Conn |
| 6,943,429 B1 | 9/2005 | Glenn et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,790,543 B2 | 9/2010 | Abadeer et al. |
| 7,855,101 B2 | 12/2010 | Furman et al. |
| 7,868,419 B1 | 1/2011 | Kerr et al. |
| 7,960,218 B2 | 6/2011 | Ma et al. |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,963,321 B2 | 2/2015 | Lenniger et al. |
| 9,165,793 B1 | 10/2015 | Wang et al. |
| 9,368,429 B2 | 6/2016 | Ma et al. |
| 9,461,001 B1 * | 10/2016 | Tsai ..................... H01L 23/552 |
| 9,859,254 B1 | 1/2018 | Yu et al. |
| 2001/0004131 A1 | 6/2001 | Masayuki et al. |
| 2002/0185675 A1 | 12/2002 | Furukawa |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0108585 A1 | 5/2006 | Gan et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2012/0003813 A1 | 1/2012 | Chuang et al. |
| 2012/0068276 A1 | 3/2012 | Lin et al. |
| 2012/0094418 A1 | 4/2012 | Grama et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0235990 A1 | 8/2015 | Cheng et al. |
| 2015/0235993 A1 | 8/2015 | Cheng et al. |

(56) References Cited

U.S. PATENT DOCUMENTS

| | | | |
|---|---|---|---|
| 2015/0243881 A1* | 8/2015 | Sankman | H01L 23/295 |
| | | | 361/679.55 |
| 2015/0255368 A1 | 9/2015 | Costa | |
| 2015/0262844 A1 | 9/2015 | Meyer et al. | |
| 2015/0279789 A1* | 10/2015 | Mahajan | H01L 23/552 |
| | | | 257/659 |
| 2015/0311132 A1 | 10/2015 | Kuo et al. | |
| 2015/0364344 A1 | 12/2015 | Yu et al. | |
| 2015/0380523 A1 | 12/2015 | Hekmatshoartabari et al. | |
| 2016/0002510 A1 | 1/2016 | Champagne et al. | |
| 2016/0079137 A1 | 3/2016 | Leipold et al. | |
| 2016/0093580 A1 | 3/2016 | Scanlan et al. | |
| 2016/0155706 A1* | 6/2016 | Yoneyama | H01L 23/552 |
| | | | 257/77 |
| 2016/0284568 A1 | 9/2016 | Morris et al. | |
| 2016/0343592 A1* | 11/2016 | Costa | H01L 23/3135 |
| 2017/0190572 A1 | 7/2017 | Pan et al. | |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Anderson, D.R., "Thermal Conductivity of Polymers," Sandia Corporation, Mar. 8, 1966, pp. 677-690.

Author Unknown, "CoolPoly D5108 Thermally Conductive Polyphenylene Sulfide (PPS)," Cool Polymers, Inc., Aug. 8, 2007, 2 pages.

Author Unknown, "CoolPoly D5506 Thermally Conductive Liquid Crystalline Polymer (LCP)," Cool Polymers, Inc., Dec. 12, 2013, 2 pages.

Author Unknown, "CoolPoly D-Series—Thermally Conductive Dielectric Plastics," Cool Polymers, Retrieved Jun. 24, 2013, http://coolpolymers.com/dseries.asp, 1 page.

Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.

Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.

Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.

Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

Author Unknown, "CoolPoly Selection Tool," Cool Polymers, Inc., 2006, 1 page, http://www.coolpolymers.com/select.asp?Application=Substrates+%26+Electcronic_Packaging.

Author Unknown, "CoolPoly Thermally Conductive Plastics for Dielectric Heat Plates," Cool Polymers, Inc., 2006, 2 pages, http://www.coolpolymers.com/heatplate.asp.

Author Unknown, "CoolPoly Thermally Conductive Plastics for Substrates and Electronic Packaging," Cool Polymers, Inc., 2005, 1 page.

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.

Author Unknown, "Heat Transfer," Cool Polymers, Inc., 2006, http://www.coolpolymers.com/heattrans.html, 2 pages.

Author Unknown, "Plastics that Conduct Heat," Plastics Technology Online, Jun. 2001, Retrieved Jun. 24, 2013, http://www.ptonline.com/articles/plastics-that-conduct-heat, 4 pages.

Author Unknown, "Sapphire Substrate," from CRC Handbook of Chemistry and Physics, Date Unknown, 1 page.

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

Author Unknown, "Thermal Properties of Solids," PowerPoint Presentation, No Date, 28 slides, http://www.phys.huji.ac.il/Phys_Hug/Lectures/77602/PHONONS_2_thermal.pdf.

Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.

Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.

Costa, J., "RFCMOS SOI Technology for 4G Reconfigurable RF Solutions," Session WEC1-2, Proceedings of the 2013 IEEE International Microwave Symposium, 4 pages.

Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.

Finne, R. M. et al., "A Water-Amine-Complexing Agent System for Etching Silicon," Journal of the Electrochemical Society, vol. 114, No. 9, Sep. 1967, pp. 965-970.

Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.

Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.

Joshi, V. et al., "MEMS Solutions in RF Applications," 2013 IEEE SOI-3D-Subthreshold Microelectronics Technology Unified Conference (S3S), Oct. 2013, IEEE, 2 pages.

Jung, Boo Yang, et al., "Study of FCMBGA with Low CTE Core Substrate," 2009 Electronic Components and Technology Conference, May 2009, pp. 301-304.

Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.

Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.

Lederer, Dimitri et al., "Substrate loss mechanisms for microstrip and CPW transmission lines on lossy silicon wafers," Solid-State Electronics, vol. 47, No. 11, Nov. 2003, pp. 1927-1936.

Lee, Kwang Hong et al., "Integration of III-V materials and Si-CMOS through double layer transfer process," Japanese Journal of Applied Physics, vol. 54, Jan. 2015, pp. 030209-1 to 030209-5.

Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.

(56) References Cited

OTHER PUBLICATIONS

Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
U.S. Appl. No. 13/852,648, filed Mar. 28, 2013.
U.S. Appl. No. 14/315,765, filed Jun. 26, 2014.
U.S. Appl. No. 14/260,909, filed Apr. 24, 2014.
U.S. Appl. No. 14/261,029, filed Apr. 24, 2014; now U.S. Pat. No. 9,214,337.
U.S. Appl. No. 14/529,870, filed Oct. 31, 2014.
U.S. Appl. No. 15/293,947, filed Oct. 14, 2016.
U.S. Appl. No. 14/715,830, filed May 19, 2015.
U.S. Appl. No. 14/851,652, filed Sep. 11, 2015.
U.S. Appl. No. 14/872,910, filed Oct. 1, 2015.
U.S. Appl. No. 14/959,129, filed Dec. 4, 2015.
U.S. Appl. No. 15/173,037, filed Jun. 3, 2016.
U.S. Appl. No. 15/085,185, filed Mar. 30, 2016.
U.S. Appl. No. 15/229,780, filed Aug. 5, 2016.
U.S. Appl. No. 15/262,457, filed Sep. 12, 2016.
U.S. Appl. No. 15/287,273, filed Oct. 6, 2016.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages.
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Non-Final Office Action for U.S. Appl. No. 15/173,037, dated Jan. 10, 2017, 8 pages.

(56) References Cited

OTHER PUBLICATIONS

Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,243, dated Aug. 31, 2016, 8 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 15/085,185, dated Feb. 15, 2017, 10 pages.
Non-Final Office Action for U.S. Appl. No. 15/293,947, dated Apr. 7, 2017, 12 pages.
Notice of Allowance for U.S. Appl. No. 14/851,652, dated Apr. 11, 2017, 9 pages.
Final Office Action for U.S. Appl. No. 15/173,037, dated May 2, 2017, 13 pages.
Non-Final Office Action for U.S. Appl. No. 15/353,346, dated May 23, 2017, 15 pages.
Non-Final Office Action for U.S. Appl. No. 15/085,185, dated Jun. 6, 2017, 5 pages.
Notice of Allowance for U.S. Appl. No. 15/293,947, dated Aug. 14, 2017, 7 pages.
Corrected Notice of Allowance for U.S. Appl. No. 14/851,652, dated Jul. 24, 2017, 6 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Notice of Allowance for U.S. Appl. No. 14/885,202, dated Jul. 24, 2017, 8 pages.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/408,560, dated Sep. 25, 2017, 8 pages.
Notice of Allowance for U.S. Appl. No. 15/353,346, dated Sep. 25, 2017, 9 pages.
Supplemental Notice of Allowability for U.S. Appl. No. 15/287,273, dated Sep. 7, 2017, 5 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Non-Final Office Action for U.S. Appl. No. 15/652,826, dated Nov. 3, 2017, 5 pages.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Final Office Action for U.S. Appl. No. 15/262,457, dated Dec. 19, 2017, 12 pages.
Non-Final Office Action for U.S. Appl. No. 15/491,064, dated Jan. 2, 2018, 9 pages.
Notice of Allowance for U.S. Appl. No. 15/648,082, dated Nov. 29, 2017, 8 pages.
Supplemental Notice of Allowability for U.S. Appl. No. 15/287,273, dated Jan. 17, 2018, 5 pages.
Non-Final Office Action for U.S. Appl. No. 15/387,855, dated Jan. 16, 2018, 7 pages.
International Preliminary Report on Patentability for PCT/US2016/045809, dated Feb. 22, 2018, 8 pages.
Non-Final Office Action for U.S. Appl. No. 15/795,915, dated Feb. 23, 2018, 6 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.

\* cited by examiner

MICROELECTRONICS PACKAGE WITH INDUCTIVE ELEMENT AND MAGNETICALLY ENHANCED MOLD COMPOUND COMPONENT

RELATED APPLICATIONS

This application claims the benefit of provisional patent application Ser. No. 62/333,317, filed May 9, 2016. This application is related to concurrently filed U.S. patent application Ser. No. 15/287,273, entitled "MICROELECTRONICS PACKAGE WITH INDUCTIVE ELEMENT AND MAGNETICALLY ENHANCED MOLD COMPOUND COMPONENT" the disclosures of which are hereby incorporated herein by reference in their entirety.

FIELD OF THE DISCLOSURE

The present disclosure relates to a microelectronics package and a process for making the same, and more particularly to a microelectronics package with an inductive element and a magnetically enhanced mold compound component, and a process to form the magnetically enhanced mold compound component over the inductive element.

BACKGROUND

Silicon on insulator (SOI) substrates are widely used in forming semiconductor dies due to the low cost of silicon materials, large scale capacity of wafer production, well-established semiconductor design tools, and well-established semiconductor manufacturing techniques. However, harmonic generations and low resistivity values of the SOI substrates severely limit the SOI's usage in radio-frequency (RF) applications. By using SOI substrates in RF fabrications, an interface between the silicon handle layer and an adjacent dielectric layer will generate unwanted harmonic and intermodulation products. Such spectrum degradation causes a number of significant system issues such as unwanted generation of signals in other RF bands that the system is attempting to avoid. In addition, the relatively low resistivity encountered in the silicon handle layer limits the performance and quality factor of inductive elements embedded in the semiconductor dies, such as inductors, transmission lines and couples, by the generation of unwanted RF current loss in the silicon handle layer.

Further, with the current popularity of portable communication devices, high speed and high performance transistors are more densely integrated on semiconductor dies. The amount of heat generated by the semiconductor dies will increase significantly due to the large number of transistors integrated on the semiconductor dies, the large amount of power passing through the transistors, and the high operation speed of the transistors.

Accordingly, there remains a need for improved microelectronics package designs that improve the quality factor and inductance value of the inductive elements, and accommodate the increased heat generation of the semiconductor dies. In addition, there is also a need to enhance the performance of the microelectronics package without increasing the package size.

SUMMARY

The present disclosure relates to a microelectronics package with an inductive element and a magnetically enhanced mold compound component, and a process for making the same. The disclosed microelectronics package includes a module substrate, a thinned flip-chip die with an upper surface that includes a first surface portion and a second surface portion surrounding the first surface portion, the magnetically enhanced mold compound component, and a mold compound component. The thinned flip-chip die includes a device layer with the inductive element embedded therein, a number of interconnects extending from a lower surface of the device layer and coupled to the module substrate, and a dielectric layer over an upper surface of the device layer. Herein, the inductive element is underlying the first surface portion and not underlying the second surface portion. The magnetically enhanced mold compound component is formed over the first surface portion. The mold compound component is formed over the second surface portion, not over the first surface portion, and surrounding the magnetically enhanced mold compound component.

According to an exemplary process, a precursor package including a module substrate and a thinned flip-chip die is provided. The thinned flip-chip die has an upper surface that includes a first surface portion and a second surface portion surrounding the first surface portion. The thinned flip-chip die is attached to the module substrate and includes a device layer with an inductive element that is embedded in the device layer. Herein, the inductive element is underlying the first surface portion and not underlying the second surface portion. Next, a mold compound component is provided over the second surface portion such that the mold compound component does not cover the first surface portion. Finally, a magnetically enhanced mold compound component is provided over the first surface portion to form a microelectronics package. The magnetically enhanced mold compound component is surrounded by the mold compound component.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
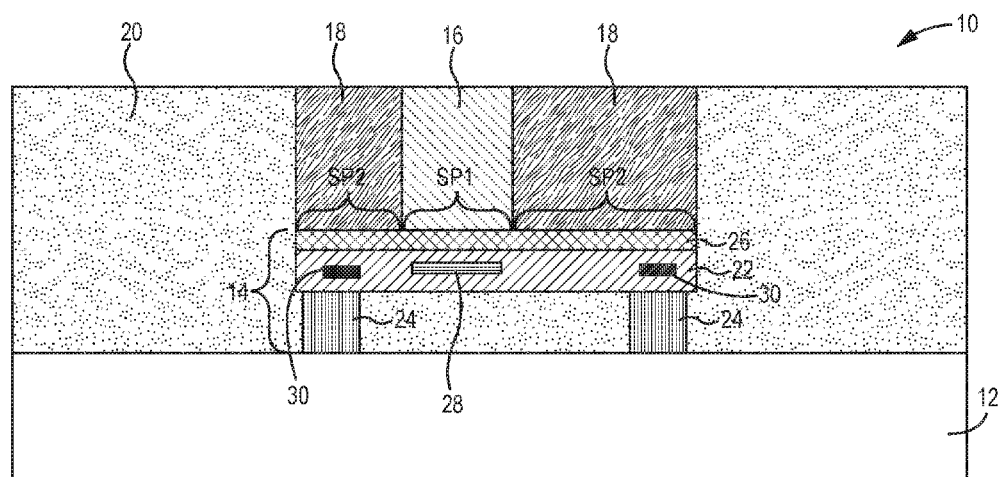
FIGS. 1A-1B show an exemplary microelectronics package with an inductive element and a magnetically enhanced mold compound component according to one embodiment of the present disclosure.

FIGS. 7-19 provide exemplary steps that illustrate a process to fabricate the exemplary microelectronics package shown in FIG. 1A.

It will be understood that for clear illustrations, FIGS. 1A-19 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
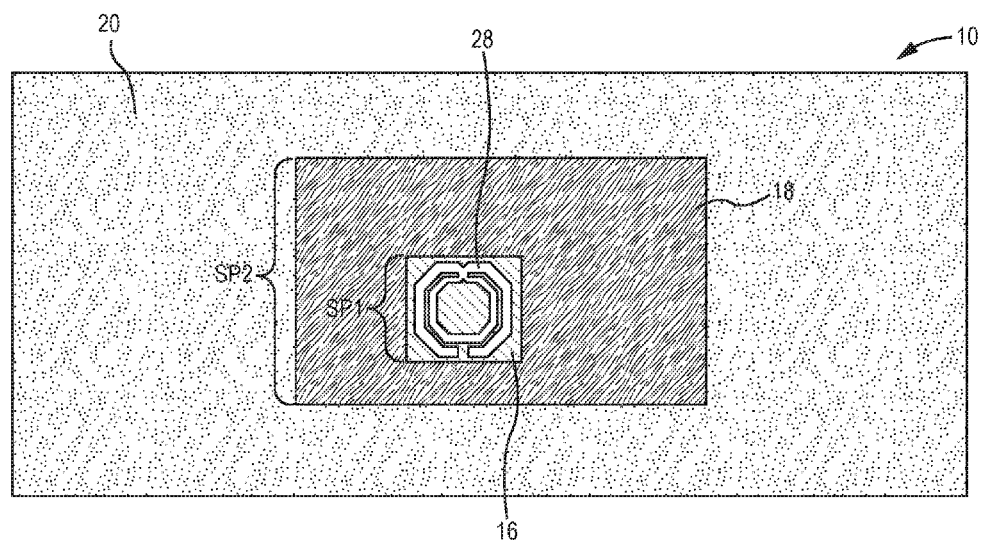

The present disclosure relates to a microelectronics package having an inductive element and a magnetically enhanced mold compound component, and a process for making the same. FIGS. 1A and 1B provide an exemplary microelectronics package 10 according to one embodiment of the present disclosure. FIG. 1A shows a cross-sectional view of the exemplary microelectronics package 10, and FIG. 1B shows a top view of the exemplary microelectronics package 10. For the purpose of this illustration, the microelectronics package 10 includes a module substrate 12, a thinned flip-chip die 14, a first magnetically enhanced mold compound component 16, a first mold compound component 18, and a second mold compound component 20. In different applications, the microelectronics package 10 may include multiple thinned flip-chip dies.

In detail, the module substrate 12 may be formed from a laminate, a wafer level fan out (WLFO) carrier, a lead frame, a ceramic carrier, or the like. The thinned flip-chip die 14 includes a device layer 22, a number of interconnects 24 extending from a lower surface of the device layer 22 and coupled to the module substrate 12, a dielectric layer 26 over an upper surface of the device layer 22, and essentially no silicon handle layer (not shown) over the dielectric layer 26. Herein, essentially no silicon handle layer over the dielectric layer 26 refers to at most 2 μm silicon handle layer over the dielectric layer 26. The thinned flip-chip die 14 has an upper surface including a first surface portion SP1 and a second surface portion SP2 surrounding the first surface portion SP1. In some applications, the upper surface of the thinned flip-chip die 14 is an upper surface of the dielectric layer 26. For other cases, the upper surface of the thinned flip-chip die 14 is an upper surface of the thin layer of the silicon handle layer (not shown). The device layer 22 may be formed of silicon oxide or the like, and the dielectric layer 26 may be formed of silicon oxide or the like, which may serve as an etch stop in a process to remove the silicon handle layer (more details in following discussion). Within the device layer 22, an inductor 28 and a number of non-inductive elements 30 (such as diodes, transistors, mechanical switches, and resonators) may be embedded. The inductor 28 is underlying the first surface portion SP1 of the thinned flip-chip die 14 and not underlying the second surface portion SP2 of the thinned flip-chip die 14. The non-inductive elements 30 are underlying the second surface portion SP2 of the thinned flip-chip die 14.

The first magnetically enhanced mold compound component 16 is formed directly over the first surface portion SP1 of the thinned flip-chip die 14, while the first mold compound component 18 is formed directly over the second surface portion SP2 of the thinned flip-chip die 14 and not over the first surface portion SP1 of the thinned flip-chip die 14. The first mold compound component 18 is surrounding the first magnetically enhanced mold compound component 16. Consequently, the first magnetically enhanced mold compound component 16 resides over the inductor 28 and the first mold compound component 18 resides over the non-inductive elements 30. Because the first magnetically enhanced mold compound component 16 is adjacent to the inductor 28 and has a magnetically enhanced feature, the first magnetically enhanced mold compound component 16 may significantly increase the inductance value of the inductor 28 and/or improve the quality factor of the inductor 28. Normally, an upper surface of the first magnetically enhanced mold compound component 16 is coplanar with an upper surface of the first mold compound component 18. The first magnetically enhanced mold compound component 16 has a thickness between 1 μm and 400 μm.

The first magnetically enhanced mold compound component 16 may be formed from polymer mixed with at least one magnetically enhanced powder, where the at least one magnetically enhanced powder may be a ferro-magnetic material or a ferri-magnetic material. One exemplary magnetically enhanced powder is sintered Magnesium-Zinc. Utilizing different magnetically enhanced powders, or with different concentrations of one magnetically enhanced powder, the first magnetically enhanced mold compound component 16 may have 1.1 times to 1000 times improvement in the magnetic permeability.

The first mold compound component 18 may be a high thermal conductivity mold compound component and may be formed from a thermoset or thermoplastic material. Compared to a normal mold compound component having 1 w/m·k thermal conductivity, a high thermal conductivity mold compound component may have 2.5 w/m·k~50 w/m·k or greater thermal conductivity, such as Hitachi Chemical Electronic Materials GE-506HT. The higher the thermal conductivity, the better the heat dissipation performance of the microelectronics package 10.

In addition, the second mold compound component 20 resides over the module substrate 12 and encapsulates at least the sides of the first mold compound component 18 and the thinned flip-chip die 14. In some applications, a portion of the first mold compound component 18 may reside over an upper surface of the second mold compound component 20 (not shown). Herein, the second mold compound component 20 may be formed from the same or different material as the first mold compound component 18. However, unlike the first mold compound component 18, the second mold compound component 20 does not have a thermal conductivity requirement in higher performing embodiments. One exemplary material used to form the second mold compound component 20 is an organic epoxy resin system.

Figure 2:
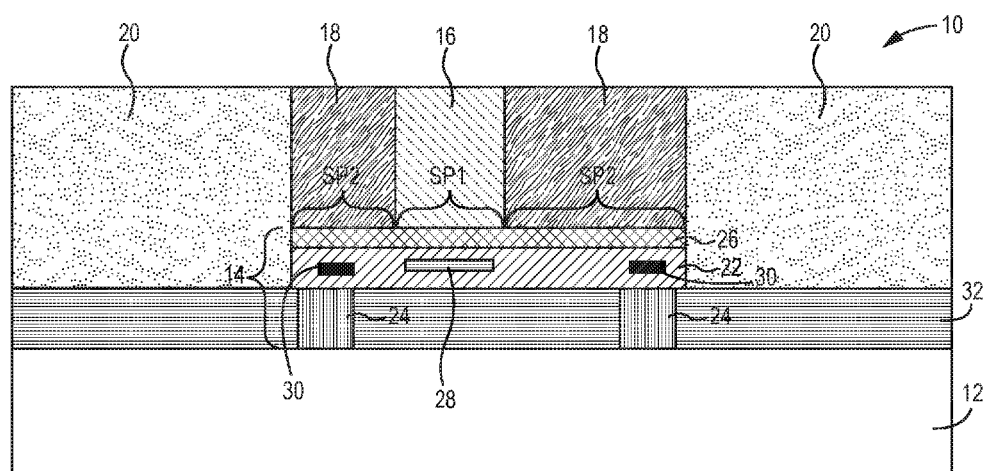
FIG. 2 shows an alternative microelectronics package with an inductive element and a magnetically enhanced mold compound component according to one embodiment of the present disclosure.

In some applications, the microelectronics package 10 may further include an underfilling layer 32, as shown in FIG. 2. The underfilling layer 32 resides over the upper surface of the module substrate 12, such that the underfilling layer 32 encapsulates the interconnects 24 and underfills the thinned flip-chip die 14 between the lower surface of the device layer 22 and the upper surface of the module substrate 12. Herein, the second mold compound component 20 resides over the underfilling layer 32, and encapsulates at least the sides of the first mold compound component 18, the sides of the dielectric layer 26, and the sides of the device layer 22. The underfilling layer 32 may be formed from the same or different material as the second mold compound component 20.

Figure 3A:
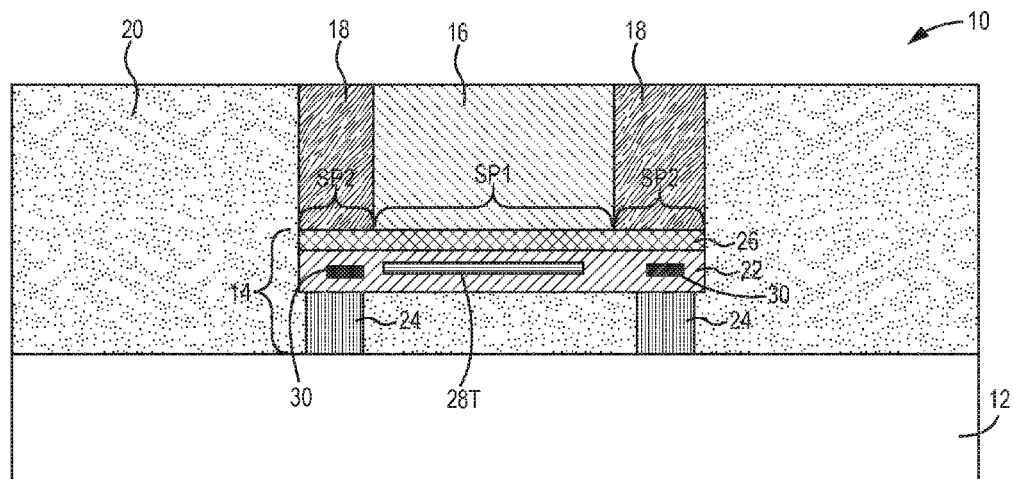
FIGS. 3A-3B show an exemplary microelectronics package with an inductive element and a magnetically enhanced mold compound component according to one embodiment of the present disclosure.
Figure 3B:
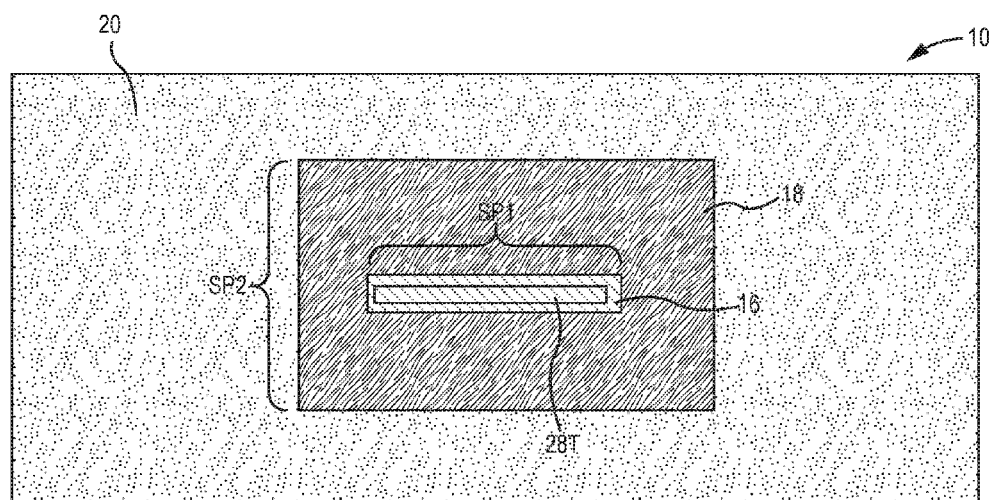
Figure 4A:
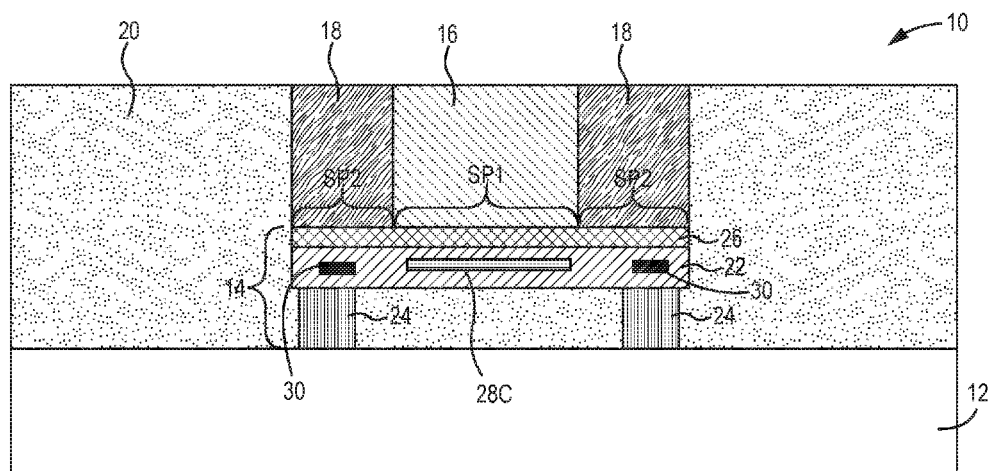
FIGS. 4A-4B show an exemplary microelectronics package with an inductive element and a magnetically enhanced mold compound component according to one embodiment of the present disclosure.
Figure 4B:
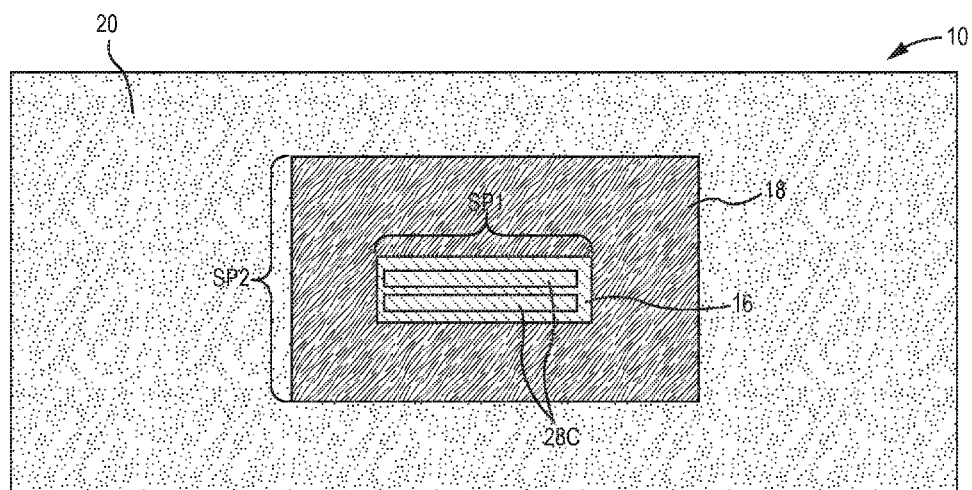

It will be clear to those skilled in the art that other inductive elements may be embedded in the device layer 22 of the thinned flip-chip die 14. As shown in FIGS. 3A-3B, a transmission line 28T is embedded in the device layer 22 and the first magnetically enhanced mold compound component 16 resides over the transmission line 28T. Further, as shown in FIGS. 4A-4B, a coupler 28C is embedded in the device layer 22 of the thinned flip-chip die 14 and the first magnetically enhanced mold compound component 16 resides over the coupler 28C.

Figure 5A:
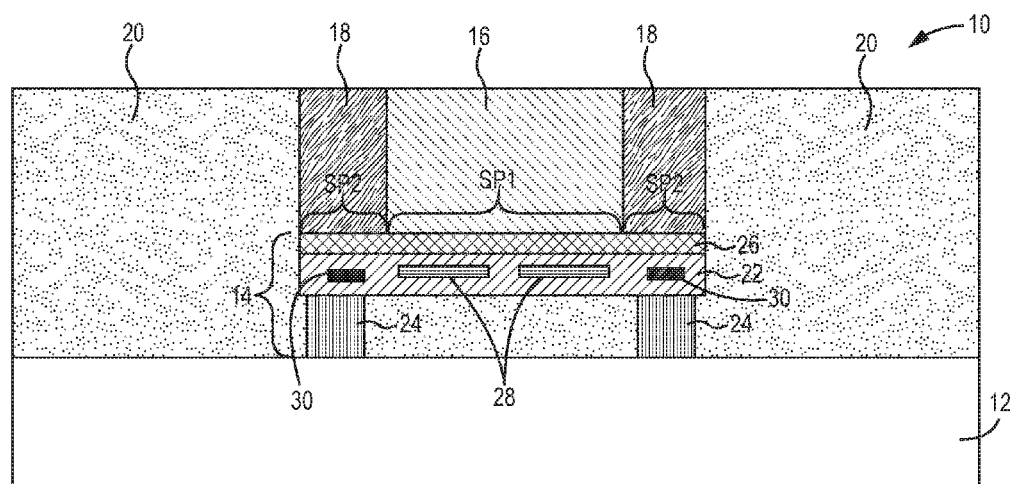
FIGS. 5A-5B show an exemplary microelectronics package with multiple inductive elements and a magnetically enhanced mold compound component according to one embodiment of the present disclosure.
Figure 5B:
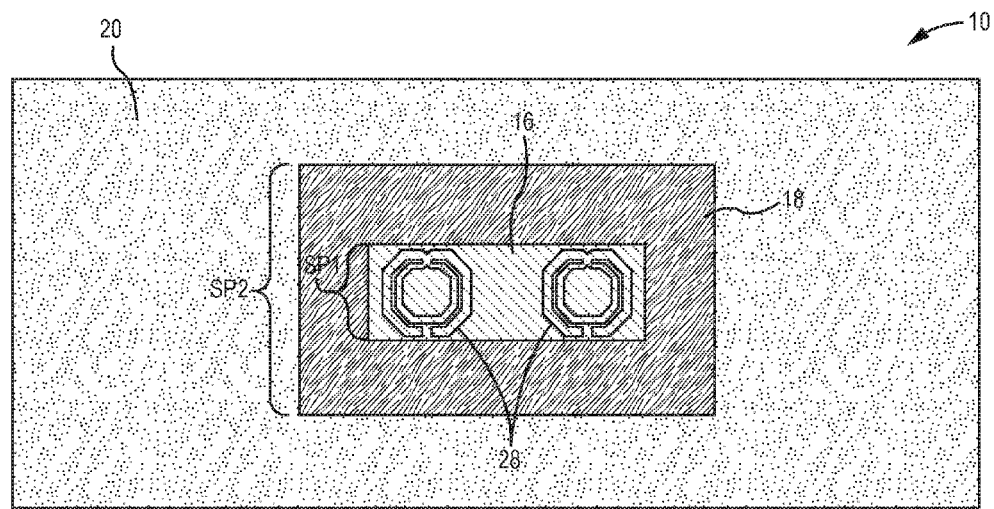

In another embodiment, as shown in FIGS. 5A-5B, the first magnetically enhanced mold compound component 16 may reside over multiple inductors 28 that are embedded in the device layer 22. Herein, the first magnetically enhanced mold compound component 16 is a contiguous section, which may increase coupling between the adjacent inductors 28. In different applications, other inductive elements (such as transmission lines and couplers) may also reside under the same contiguous section of the first magnetically enhanced mold compound component 16. These multiple inductive elements embedded in the device layer 22 may be laterally adjacent to each other without overlaps.

Figure 6A:
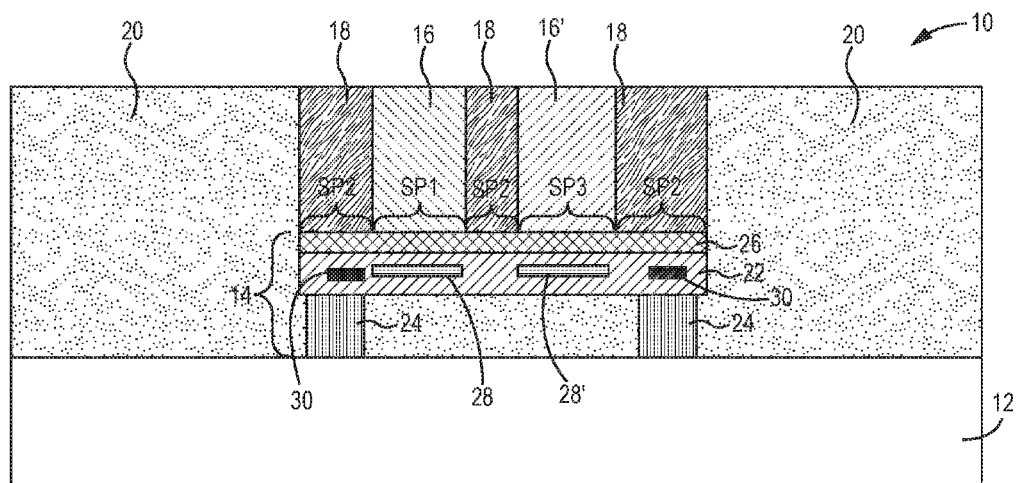
FIGS. 6A-6B show an exemplary microelectronics package with multiple inductive elements and multiple magnetically enhanced mold compound components according to one embodiment of the present disclosure.
Figure 6B:
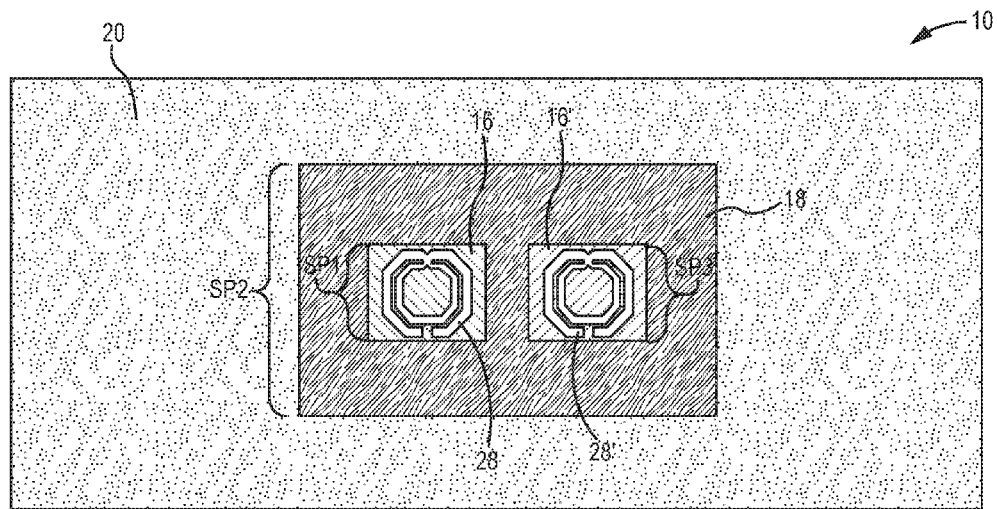

In another embodiment, as shown in FIGS. 6A-6B, the thinned flip-chip die 14 has an upper surface including a first surface portion SP1, a second surface portion SP2, and a third surface portion SP3. The second surface portion SP2 is surrounding the first surface portion SP1 and the third surface portion SP3, and the second surface portion SP2 may separate the first surface portion SP1 from the third surface portion SP3. There is a first inductor 28, which is embedded in the device layer 22, underlying the first surface portion SP1 and not underlying the second surface portion SP2. Also, there is a second inductor 28', which is embedded in the device layer 22, underlying the third surface portion SP3 and not underlying the second surface portion SP2. The first magnetically enhanced mold compound component 16 is formed directly over the first surface portion SP1 of the thinned flip-chip die 14, while a second magnetically enhanced mold compound component 16' is formed directly over the third surface portion SP3 of the thinned flip-chip die 14. The first mold compound component 18 is formed directly over the second surface portion SP2 of the thinned flip-chip die 14 and not over the first surface portion SP1 or the third surface portion SP3 of the thinned flip-chip die 14. Both the first magnetically enhanced mold compound component 16 and the second magnetically enhanced mold compound component 16' are surrounded by the first mold compound component 18. The first magnetically enhanced mold compound component 16 may be separated from the second magnetically enhanced mold compound component 16' by the first mold compound component 18. In different applications, the first magnetically enhanced mold compound component 16 and the second magnetically enhanced mold compound component 16' may be formed from an identical material or formed from different materials. By definition, materials are different if they include different elements or have a different element composition. Utilizing different materials or with different concentrations of one magnetically enhanced powder, the first magnetically enhanced mold compound 16 and the second magnetically enhanced mold compound 16' may have different degrees of magnetic enhancement. Further, the first inductor 28 and/or the second inductor 28' may be replaced by other inductive elements (such as transmission lines and couplers).

FIGS. 7-19 provide exemplary steps to fabricate the exemplary microelectronics package 10 shown in FIG. 1A. Although the exemplary steps are illustrated in a series, the exemplary steps are not necessarily order dependent. Some steps may be done in a different order than that presented.

Further, processes within the scope of this disclosure may include fewer or more steps than those illustrated in FIGS. 7-19.

Figure 7:
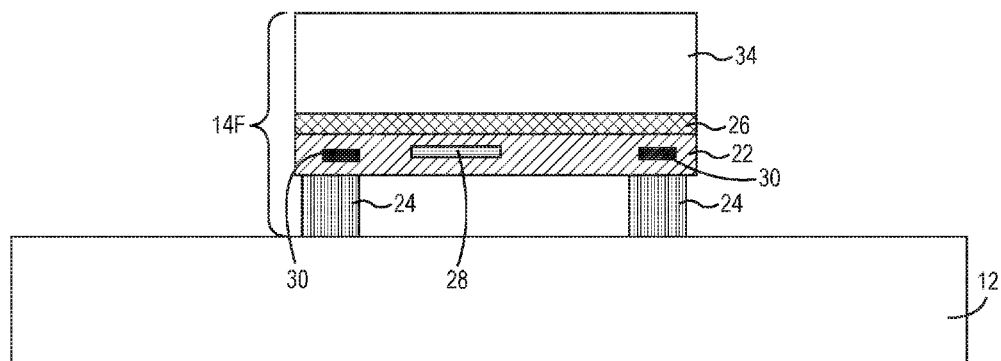

Initially, a flip-chip die 14F is attached to an upper surface of the module substrate 12 as depicted in FIG. 7. For the purpose of this illustration, the flip-chip die 14F includes the device layer 22, the interconnects 24 extending from the lower surface of the device layer 22 and coupled to the module substrate 12, the dielectric layer 26 over the upper surface of the device layer 22, and a silicon handle layer 34 over the dielectric layer 26. As such, the backside of the silicon handle layer 34 will generally be the tallest component after the attaching process. Within the device layer 22, the inductor 28 and the non-inductive elements 30 (such as diodes, transistors, mechanical switches, and resonators) may be embedded. The device layer 22 may have a thickness between 4 µm and 7 µm, the interconnects 24 may have a thickness between 15 µm and 200 µm, the dielectric layer 26 may have a thickness between 0.2 µm and 2 µm, and the silicon handle layer 34 may have a thickness between 150 µm and 500 µm. It will be clear to those skilled in the art that modifications to these thicknesses may be also considered within the scope of the concepts disclosed herein.

Figure 8:
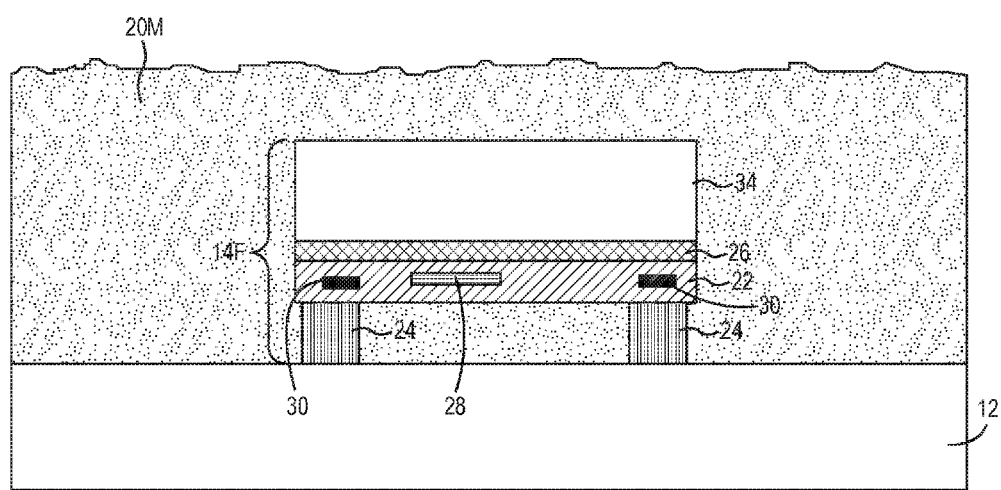

A second mold compound 20M is then applied over the upper surface of the module substrate 12 such that the flip-chip die 14F is encapsulated by the second mold compound 20M as illustrated in FIG. 8. The second mold compound 20M may be applied by various procedures, such as sheet molding, overmolding, compression molding, transfer molding, dam fill encapsulation, and screen print encapsulation. The second mold compound 20M may be formed from an organic epoxy resin system or the like, such as Hitachi Chemical Electronic Materials GE-100LFC, which can be used as an etchant barrier to protect the flip-chip die 14F against etching chemistries such as potassium hydroxide (KOH), sodium hydroxide (NaOH), and acetylcholine (ACH). A curing process (not shown) is followed to harden the second mold compound 20M to form the second mold compound component 20. The curing temperature may be between 125° C. and 300° C. depending on which material is used as the second mold compound 20M.

Notice that, if the final microelectronics package 10 includes the underfilling layer 32, which is formed from a different material to the second mold compound 20M, there may be extra steps to form the underfilling layer 32 (not shown) before applying the second mold compound 20M over the upper surface of the module substrate 12. Forming the underfilling layer 32 is provided by applying an underfilling material over the upper surface of the module substrate 12 and then curing the underfilling material to form the underfilling layer 32. The underfilling layer 32 encapsulates the interconnects 24 and underfills the flip-chip die 14F between the lower surface of the device layer 22 and the upper surface of the module substrate 12. The second mold compound 20M is then applied over the underfilling layer 32, and encapsulates at least the sides of the silicon handle layer 34, the sides of the dielectric layer 26, and the sides of the device layer 22. A curing process (not shown) is followed to harden the second mold compound 20M to form the second mold compound component 20.

Figure 9:
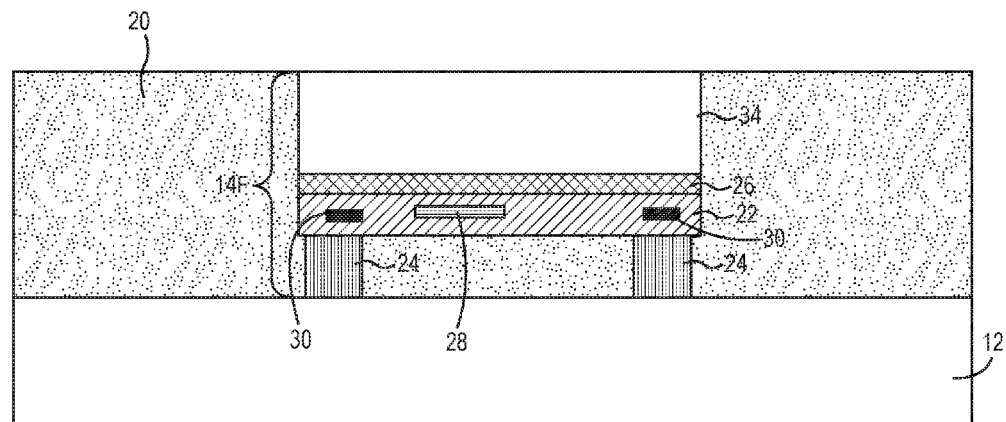
Figure 10:
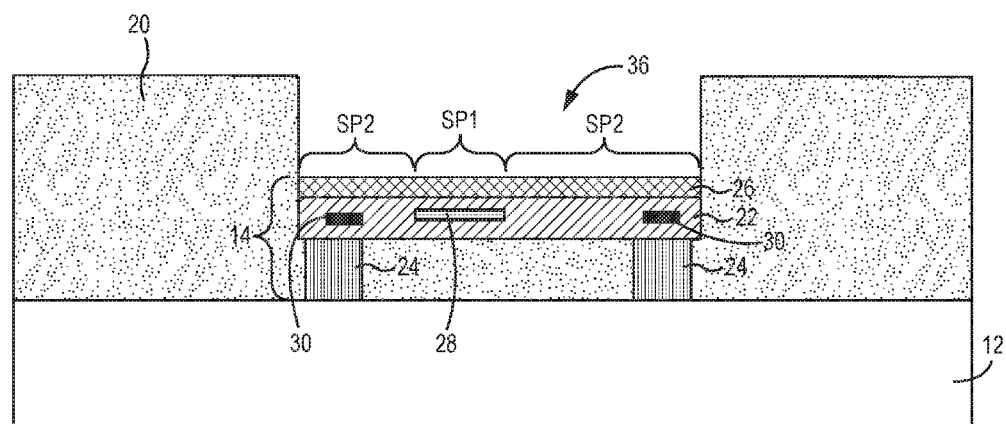

Next, the second mold compound component 20 is thinned down to expose the backside of the silicon handle layer 34 of the flip-chip die 14F, as shown in FIG. 9. The thinning procedure may be done with a mechanical grinding process. The following step is to remove substantially the entire silicon handle layer 34 of the flip-chip die 14F to provide the thinned flip-chip die 14 that has the upper surface at a bottom of a first cavity 36, as shown in FIG. 10. Herein, removing substantially the entire silicon handle layer 34 refers to removal of at least 95% of the entire silicon handle layer 34, and perhaps a portion of the dielectric layer 26. As such, in some applications, the thinned flip-chip die 14 may refer to a device including a device layer 22, a dielectric layer 26 over the upper surface of the device layer 22, and the interconnects 24 extending from the lower surface of the device layer 22 and coupled to the module substrate 12, where the upper surface of the dielectric layer 26 is the upper surface of the thinned flip-chip die 14. For other cases, the thinned flip-chip die 14 may refer to a device including a device layer 22, a dielectric layer 26 over an upper surface of the device layer 22, a thin layer (less than 1 µm) of the silicon handle layer 34 left over the dielectric layer 26, and a number of interconnects 24 extending from the lower surface of the device layer 22 and coupled to the module substrate 12, where the upper surface of the thin layer of the silicon handle layer 34 is the upper surface of the thinned flip-chip die 14. Removing substantially the entire silicon handle layer 34 may be provided by an etching process with a wet/dry etchant chemistry, which may be KOH, ACH, NaOH or the like.

Further, the upper surface of the thinned flip-chip die 14 includes the first surface portion SP1 and the second surface portion SP2 surrounding the first surface portion SP1. The inductor 28 embedded in the device layer 22 is underlying the first surface portion SP1 and not underlying the second surface portion SP2. The non-inductive elements 30 embedded in the device layer 22 are underlying the second surface portion SP2 of the thinned flip-chip die 14.

Figure 11:
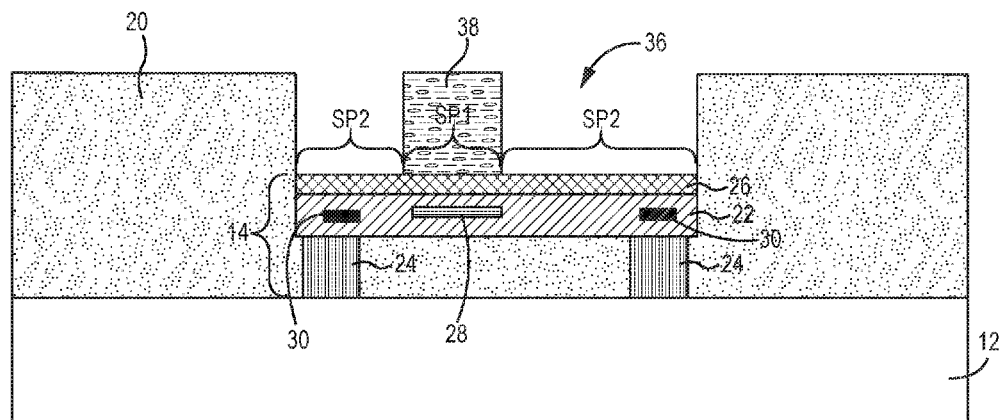

With reference to FIGS. 11 through 14, a process for providing a first mold compound component 18 over the second surface portion SP2 of the thinned flip-chip die 14 is illustrated according to one embodiment of the present disclosure. After the removing step is done, a molding block 38 is placed within the first cavity 36 and over the first surface portion SP1 of the thinned flip-chip die 14, as illustrated in FIG. 11. Herein, only the first surface portion SP1 of the thinned flip-chip die 14 is blocked by the molding block 38, while the second surface portion SP2 of the thinned flip-chip die 14 is exposed to the first cavity 36. The molding block 38 may be formed from a suitable patternable sacrificial material, such as polyimide, with a height between 2 µm and 300 µm. Normally, the height of the molding block 34 is no less than a depth of the first cavity 36.

Figure 12:
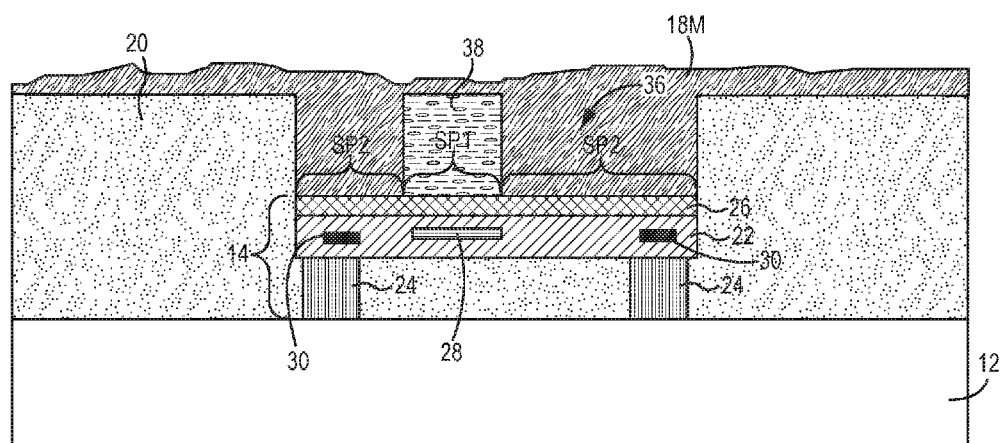

Next, a first mold compound 18M is applied to substantially fill the first cavity 36, and directly contacts the second surface portion SP2 of the thinned flip-chip die 14, as illustrated in FIG. 12. The first mold compound 18M may encapsulate the molding block 38 and reside over an upper surface of the second mold compound component 20, but does not directly reside over the first surface portion SP1 of the thinned flip-chip die 14. The first mold compound 18M may be applied by various procedures, such as sheet molding, overmolding, compression molding, transfer molding, dam fill encapsulation, and screen print encapsulation. A curing process (not shown) is followed to harden the first mold compound 18M in order to form the first mold compound component 18. The curing temperature is between 125° C. and 300° C. depending on which material is used as the first mold compound 18M.

Figure 13:
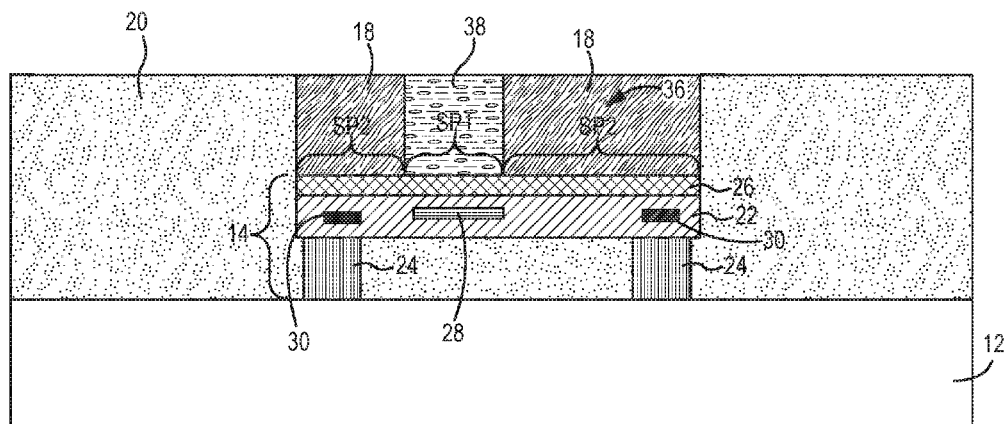
Figure 14:
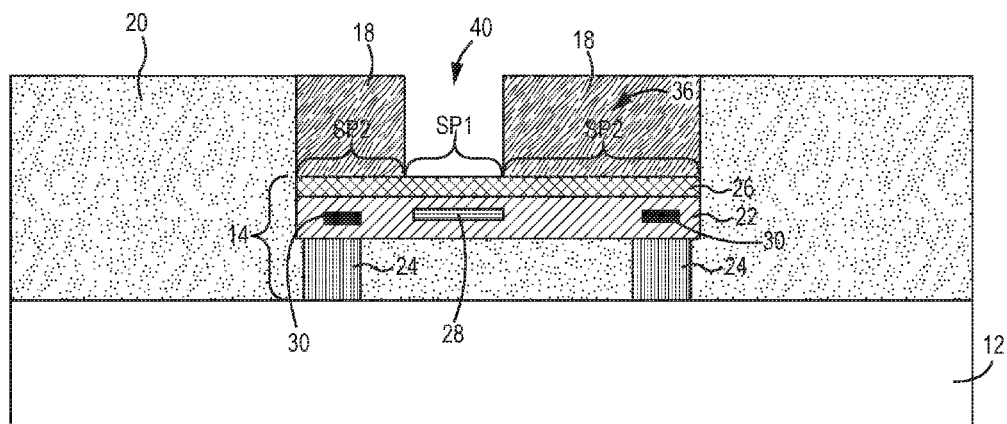

The first mold compound component 18 is then thinned to expose an upper surface of the molding block 38, as illustrated in FIG. 13. The thinning procedure may be done with a mechanical grinding process. Next, the molding block 38 is removed to form a second cavity 40 and expose the first surface portion SP1 of the thinned flip-chip die 14 at a bottom of the second cavity 40, as illustrated in FIG. 14. The removal of the molding block 38 may be provided by a dry or wet selective etching process. If the molding block 38 is formed from polyimide, a hot NaOH or KOH solution may be used in selectively removing the molding block 38.

Figure 15:
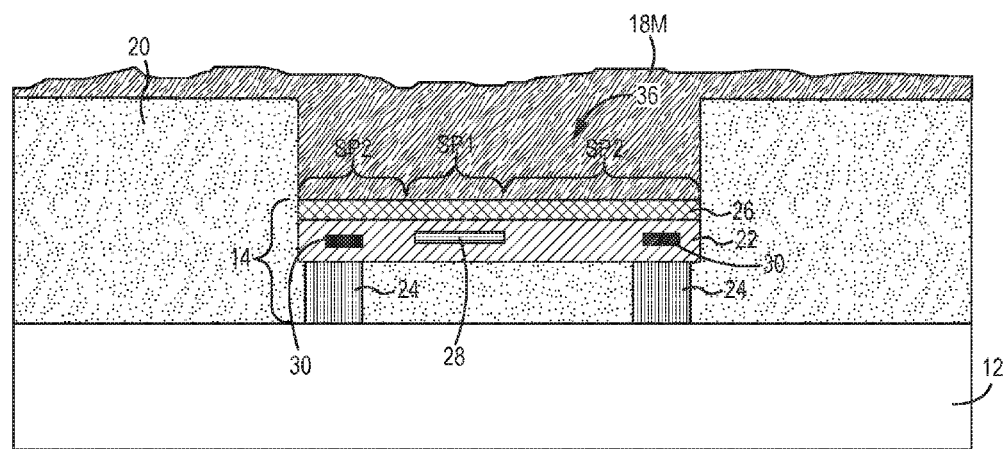
Figure 16:
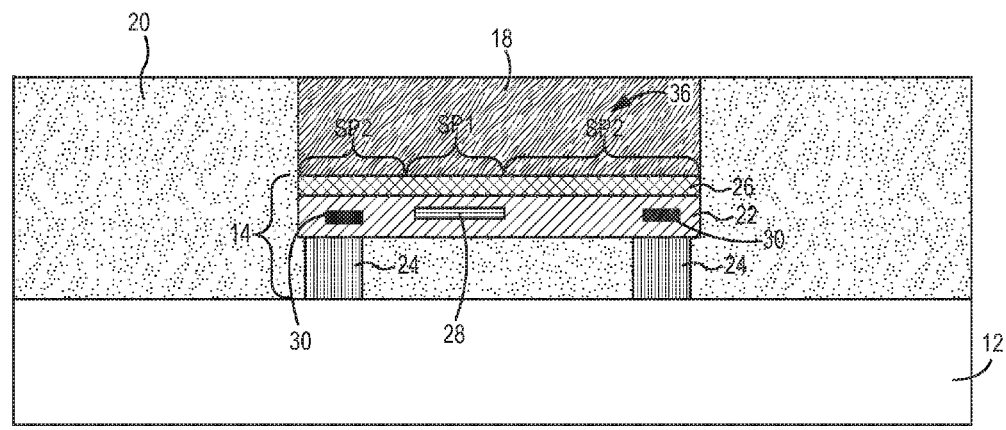
Figure 17:
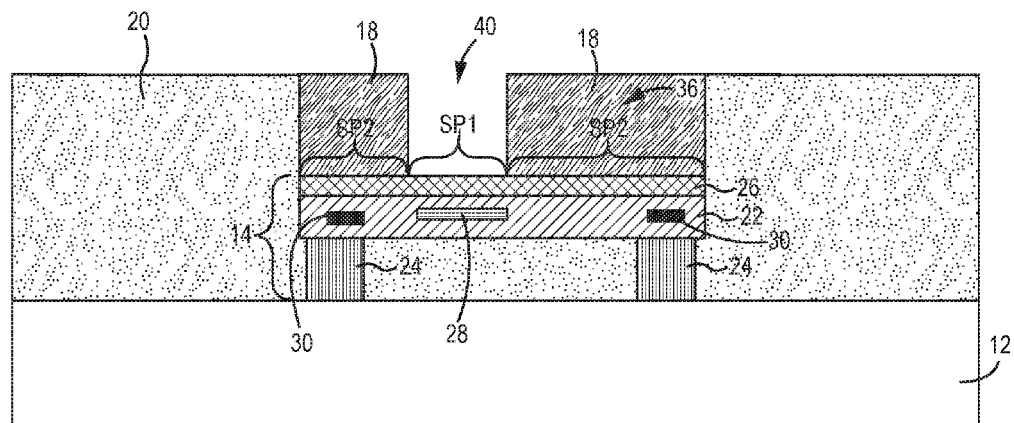

In another embodiment, an alternate process for providing the first mold compound component 18 over the second surface portion SP2 of the thinned flip-chip die 14 is illustrated in FIGS. 15-17. After the removal step is done, the first mold compound 18M is applied to substantially fill the first cavity 36, and directly contacts the upper surface of the thinned flip-chip die 14, as illustrated in FIG. 15. The first mold compound 18M may further reside over an upper surface of the second mold compound component 20. The first mold compound 18M may be applied by various procedures, such as sheet molding, overmolding, compression molding, transfer molding, dam fill encapsulation, and screen print encapsulation. A curing process (not shown) is followed to harden the first mold compound 18M to form the first mold compound component 18. The curing temperature is between 125° C. and 300° C. depending on which material is used as the first mold compound 18M.

The upper surface of the first mold compound component 18 is then planarized, as illustrated in FIG. 16. A mechanical grinding process may be used for planarization. Next, a portion of the first mold compound component 18 is removed to form the second cavity 40, as illustrated in FIG. 17. Herein, the first surface portion SP1 of the thinned flip-chip die 14 is exposed at the bottom of the second cavity 40 and the second surface portion SP2 of the thinned flip-chip die 14 is not exposed to the second cavity 40. The removal of the portion of the first mold compound component 18 to expose the first surface portion SP1 may be provided by a laser ablation system.

Figure 18:
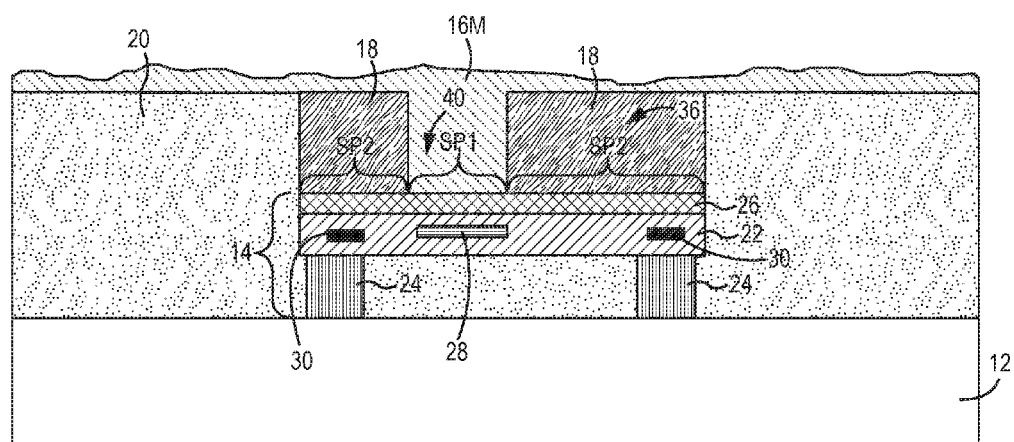
Figure 19:
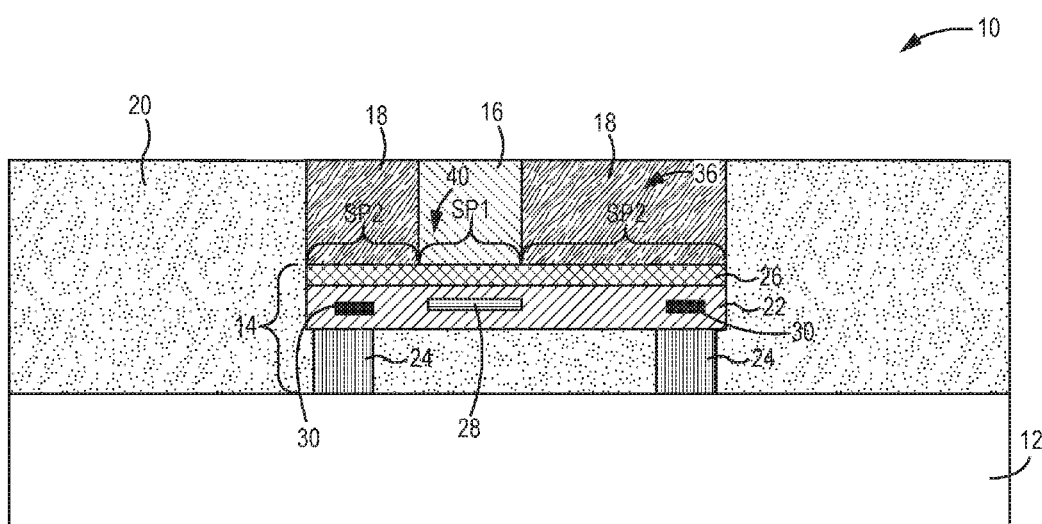

With reference to FIGS. 18 through 19, a process for providing a first magnetically enhanced mold compound component 16 over the first surface portion SP1 of the thinned flip-chip die 14 is illustrated according to one embodiment of the present disclosure. As shown in FIG. 18, the first magnetically enhanced mold compound 16M is applied to substantially fill the second cavity 40 and directly contact the first surface portion SP1. A portion of the first magnetically enhanced mold compound 16M may reside over an upper surface of the first mold compound component 18. The first magnetically enhanced mold compound 16M may be applied by various procedures, such as sheet molding, overmolding, compression molding, transfer molding, dam fill encapsulation, and screen print encapsulation. A curing process (not shown) is followed to harden the first magnetically enhanced mold compound 16M to form the first magnetically enhanced mold compound component 16. The curing temperature is between 125° C. and 300° C. depending on which material is used as the first magnetically enhanced mold compound 16M.

Finally, the upper surface of the first magnetically enhanced mold compound component 16 is planarized, such that the upper surface of the first magnetically enhanced mold compound component 16 and the upper surface of the first mold compound component 18 may be coplanar, as illustrated in FIG. 19. A mechanical grinding process may be used for planarization. Herein, the first magnetically enhanced mold compound component 16 is surrounded by the first mold compound component 18.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
    a module substrate;
    a thinned flip-chip die, which has an upper surface including a first surface portion and a second surface portion surrounding the first surface portion, comprising:
        a device layer including a first inductive element embedded therein, wherein the first inductive element is underlying the first surface portion and is not underlying the second surface portion;
        a dielectric layer over an upper surface of the device layer; and
        a plurality of interconnects extending from a lower surface of the device layer and coupled to the module substrate;
    a first magnetically enhanced mold compound component formed over the first surface portion; and
    a first mold compound component formed over the second surface portion and not over the first surface portion, wherein the first mold compound component is surrounding the first magnetically enhanced mold compound component.

2. The apparatus of claim 1 wherein:
    the upper surface of the thinned flip-chip die further includes a third surface portion surrounded by the second surface portion;
    the device layer further comprises a second inductive element embedded therein, wherein the second inductive element is underlying the third surface portion and not underlying the second surface portion; and
    a second magnetically enhanced mold compound component is formed over the third surface portion and surrounded by the first mold compound component.

3. The apparatus of claim 2 wherein the first magnetically enhanced mold compound component and the second magnetically enhanced mold compound component are formed of an identical material.

4. The apparatus of claim 2 wherein the first magnetically enhanced mold compound component and the second magnetically enhanced mold compound component are formed from different materials.

5. The apparatus of claim 1 wherein the device layer further comprises a second inductive element that is underlying the first surface portion such that the first magnetically enhanced mold compound component resides over both the first inductive element and the second inductive element.

6. The apparatus of claim 1 wherein the device layer further comprises a second inductive element that is underlying the first surface portion and laterally adjacent to the first inductive element such that the first magnetically enhanced mold compound component resides over both the first inductive element and the second inductive element.

7. The apparatus of claim 1 wherein the upper surface of the thinned flip-chip die is an upper surface of the dielectric layer.

8. The apparatus of claim 1 wherein the first magnetically enhanced mold compound component is formed from polymer mixed with at least one magnetically enhanced powder.

9. The apparatus of claim 8 wherein the at least one magnetically enhanced powder is a ferro-magnetic material or a ferri-magnetic material.

10. The apparatus of claim 8 wherein the at least one magnetically enhanced powder is sintered Magnesium-Zinc.

11. The apparatus of claim 1 wherein the first mold compound component has a thermal conductivity between 2.5w/m·k and 50w/m·k.

12. The apparatus of claim 1 further comprising a second mold compound component that resides between the module substrate and the lower surface of the device layer and encapsulates at least sides of the first mold compound component and the thinned flip-chip die.

13. The apparatus of claim 12 wherein the first mold compound component and the second mold compound component are formed from a same material.

14. The apparatus of claim 12 wherein the first mold compound component and the second mold compound component are formed from different materials.

15. The apparatus of claim 12 wherein the second mold compound component is formed from an organic epoxy resin system.

16. The apparatus of claim 12 wherein a portion of the first mold compound component further resides over an upper surface of the second mold compound component.

17. The apparatus of claim 1 wherein the dielectric layer is formed of silicon oxide.

18. The apparatus of claim 1 wherein the first inductive element is one of a group consisting of inductor, transmission line, and coupler.

19. The apparatus of claim 1 wherein the device layer further includes at least one of a group consisting of diodes, transistors, mechanical switches, and resonators.

20. The apparatus of claim 1 wherein an upper surface of the first magnetically enhanced mold compound component is coplanar with an upper surface of the first mold compound component.

21. The apparatus of claim 1 wherein a thickness of the first magnetically enhanced mold compound component is between 1 μm and 400 μm.

22. The apparatus of claim 1 wherein the module substrate is one of a group consisting of a laminate, a wafer level fan out (WLFO) carrier, a lead frame, and a ceramic carrier.

* * * * *